(12) United States Patent
Chung et al.

(10) Patent No.: US 10,229,632 B2
(45) Date of Patent: Mar. 12, 2019

(54) DISPLAY APPARATUS

(71) Applicant: Samsung Display Co., Ltd., Yongin-si, Gyeonggi-do (KR)

(72) Inventors: Yunmo Chung, Yongin-si (KR); Younjoon Kim, Yongin-si (KR); Ilhun Seo, Yongin-si (KR); Hojin Yoon, Yongin-si (KR); Daewoo Lee, Yongin-si (KR); Minseong Yi, Yongin-si (KR); Miyeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/676,097

(22) Filed: Aug. 14, 2017

(65) Prior Publication Data

US 2018/0068613 A1    Mar. 8, 2018

(30) Foreign Application Priority Data

Sep. 6, 2016  (KR) .................. 10-2016-0114450

(51) Int. Cl.
*G06F 1/26*     (2006.01)
*G09G 5/00*    (2006.01)
(Continued)

(52) U.S. Cl.
CPC ........... *G09G 3/3208* (2013.01); *G06F 3/147* (2013.01); *G09G 3/2983* (2013.01);
(Continued)

(58) Field of Classification Search
CPC .... G09G 3/3208; G09G 3/2983; G09G 5/003; G09G 2300/0408; G06F 3/147; G06F 3/0486; G06F 3/04817; G06F 3/041; G06F 1/26; G06F 1/1694; G06F 1/1635; H01L 27/1214; H01L 27/3258; H01L 27/3241;
(Continued)

(56) References Cited

U.S. PATENT DOCUMENTS 9,287,329 B1    3/2016  Lee et al.
9,414,463 B2 *  8/2016  Ka ..................... G06F 1/1601
(Continued)

FOREIGN PATENT DOCUMENTS

KR   10-2012-0023002 A    3/2012
KR   10-2014-0017145 A    2/2014
KR   10-2014-0122960 A   10/2014

*Primary Examiner* — Dao H Nguyen
(74) *Attorney, Agent, or Firm* — Lewis Roca Rothgerber Christie LLP

(57) ABSTRACT

A display apparatus includes: a first area; a first bent area outside the first area, the first bent area being bent about a first bending axis; and a second bent area outside the first area, the second bent area being adjacent to an edge of the first area extending in a direction crossing the first bending axis, and being bent about a second bending axis that is parallel with an imaginary line extending in a direction crossing the first bending axis. A cut-off portion extends into the first area, the cut-off portion being at a portion where a first line crosses a second line, the first line being parallel with the first bending axis and passing through the first bent area, and the second line being parallel with the second bending axis and passing through the second bent area.

13 Claims, 7 Drawing Sheets

(51) Int. Cl.
*H05K 7/02* (2006.01)
*G06F 3/041* (2006.01)
*G06F 3/147* (2006.01)
*G09G 3/298* (2013.01)
*H01L 27/12* (2006.01)
*H01L 51/00* (2006.01)
*G06F 3/0481* (2013.01)
*G06F 3/0486* (2013.01)
*G09G 3/3208* (2016.01)
*G06F 3/14* (2006.01)
*G06F 1/16* (2006.01)
*H01L 51/52* (2006.01)
*H01L 27/32* (2006.01)

(52) U.S. Cl.
CPC ........ *H01L 27/1214* (2013.01); *G06F 1/1635* (2013.01); *G06F 1/1694* (2013.01); *G06F 1/26* (2013.01); *G06F 3/041* (2013.01); *G06F 3/0486* (2013.01); *G06F 3/04817* (2013.01); *G09G 5/003* (2013.01); *G09G 2300/0408* (2013.01); *G09G 2380/02* (2013.01); *H01L 27/3211* (2013.01); *H01L 27/3241* (2013.01); *H01L 27/3258* (2013.01); *H01L 51/0023* (2013.01); *H01L 51/0097* (2013.01); *H01L 51/52* (2013.01); *H01L 51/5256* (2013.01); *H05K 7/02* (2013.01)

(58) Field of Classification Search
CPC . H01L 27/3211; H01L 51/0097; H01L 51/52; H01L 51/5256; H01L 51/0023; H05K 7/02
USPC ........ 257/181, 103; 313/500, 502, 506, 511; 345/156, 173, 204; 715/702, 748, 863
See application file for complete search history.

(56) References Cited

U.S. PATENT DOCUMENTS

| | | | |
|---|---|---|---|
| 9,430,180 B2* | 8/2016 | Hirakata | G06F 3/1446 |
| 2010/0065832 A1* | 3/2010 | Sugimoto | H01L 27/3293 |
| | | | 257/40 |
| 2013/0002583 A1* | 1/2013 | Jin | G06F 1/1637 |
| | | | 345/173 |
| 2014/0042406 A1 | 2/2014 | Degner et al. | |
| 2014/0306941 A1 | 10/2014 | Kim et al. | |

* cited by examiner

DISPLAY APPARATUS

CROSS-REFERENCE TO RELATED APPLICATION

This application claims priority to and the benefit of Korean Patent Application No. 10-2016-0114450, filed on Sep. 6, 2016, in the Korean Intellectual Property Office (KIPO), the disclosure of which is incorporated herein in its entirety by reference.

BACKGROUND

1. Field

One or more aspects of example embodiments relate to a display apparatus, and more particularly, to a display apparatus capable of preventing or reducing generation of defects during manufacturing processes or while in use after being manufactured.

2. Description of the Related Art

In general, a display apparatus includes a display unit on a substrate. In the display apparatus, by bending at least a part of the display apparatus, visibility at various angles may be improved and/or an area of a non-display area may be reduced.

However, during manufacture of the display apparatus that is bendable or during use of the display apparatus after being manufactured, defects may occur at a bending portion and/or at an adjacent portion to the bending portion.

The above information disclosed in this Background section is for enhancement of understanding of the background of the inventice concept, and therefore, it may contain information that does not constitute prior art.

SUMMARY

One or more aspects of example embodiments are directed toward a display apparatus capable of preventing or reducing generation of defects during manufacturing processes thereof or while in use after being manufactured.

Additional aspects will be set forth in part in the description which follows and, in part, will be apparent from the description, or may be learned by practice of the presented embodiments.

According to one or more embodiments, a display apparatus includes: a first area; a first bent area outside the first area, the first bent area being bent about a first bending axis; and a second bent area outside the first area, the second bent area being adjacent to an edge of the first area extending in a direction crossing the first bending axis, and being bent about a second bending axis that is parallel with an imaginary line extending in a direction crossing the first bending axis. A cut-off portion may extend into the first area, the cut-off portion being at a portion where a first line crosses a second line, the first line being parallel with the first bending axis and passing through the first bent area, and the second line being parallel with the second bending axis and passing through the second bent area.

The display apparatus may further include a third area separated from the first area and connected to the first area via the second bent area.

The first area may be flat.

An extension portion of the cut-off portion within the first area may have a shape that is a part of a circle on a plane parallel to the first area and partially overlapping the first area.

A center of the circle may be located outside the first area.

An extension portion of the cut-off portion within the first area may not have a sharp portion on a plane parallel to the first area.

The display apparatus may further include: a substrate; and an insulating layer over the substrate, wherein a side end surface of the substrate and a side end surface of the insulating layer form a continuous side surface at the cut-off portion.

The display apparatus may further include: a substrate; and an insulating layer over the substrate, wherein a side end surface of the substrate and a side end surface of the insulating layer form a continuous side surface at an extension portion of the cut-off portion within the first area.

A display area of the display apparatus may include at least a portion of the first area and at least a portion of the second bent area.

A radius of curvature of the first bent area may be less than a radius of curvature of the second bent area.

On a plane parallel to the first area and partially overlapping the first area, an extension portion of the cut-off portion within the first area may have a shape that is a part of a circle, and a first acute angle between a first boundary line where the first area and the first bent area meet and a tangential line at a first point where the circle and the first boundary line meet, may be less than a second acute angle between a second boundary line where the first area and the second bent area meet and a tangential line at a second point where the circle and the second boundary line meet.

A center of the circle may be located outside the first area.

On a plane parallel to the first area and partially overlapping the first area, an extension portion of the cut-off portion within the first area may have a concave curve shape, and a first acute angle between a first boundary line where the first area and the first bent area meet and a tangential line at a first point where the curve and the first boundary line meet, may be less than a second acute angle between a second boundary line where the first area and the second bent area meet and a tangential line at a second point where the curve and the second boundary line meet.

The display apparatus may further include a second area separated from the first area, and the first bent area may be between the first area and the second area to connect the first area and the second area to each other.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
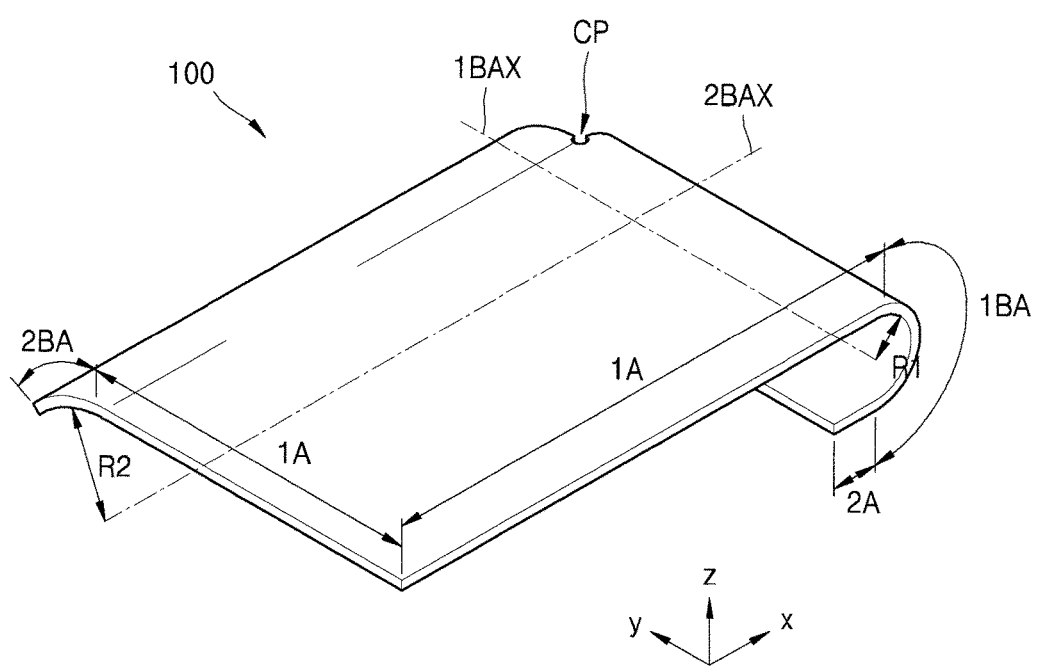
FIG. 1 is a schematic perspective view of a part of a display apparatus according to an embodiment.

Hereinafter, example embodiments will be described in more detail with reference to the accompanying drawings, in which like reference numerals refer to like elements throughout. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, an x-axis, a y-axis, and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a substrate 100 of a display apparatus according to an embodiment. Although FIG. 1 only shows the substrate 100 for convenience, an entire shape of the display apparatus may be the same or substantially the same as that of the substrate 100 illustrated in FIG. 1.

The substrate 100 may include various suitable flexible and/or bendable materials, for example, one or more polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). The substrate 100 may have a multi-layered structure including two layers having one or more of the above polymer resins, and a barrier layer including an inorganic material, such as silicon oxide, silicon nitride, and/or silicon oxynitride between the two layers.

As shown in FIG. 1, the display apparatus according to an embodiment includes a first area 1A, a second area 2A, a first bent area 1BA, and a second bent area 2BA. The first area 1A and the second area 2A are separated from each other. The first bent area 1BA extending in a first direction (+y direction) is located between the first area 1A and the second area 2A in a second direction (+x direction) that crosses the first direction, in order to connect the first area 1A to the second area 2A. For example, the first bent area 1BA of the display apparatus according to an embodiment is bent about a first bending axis 1BAX that extends in the first direction (+y direction) as shown in FIG. 1. In addition, the second bent area 2BA located outside the first area 1A is located adjacent to an edge of the first area 1A that extends in the second direction (+x direction) crossing the first bending axis 1BAX. Further, as shown in FIG. 1, the second bent area 2BA is bent about a second bending axis 2BAX that is in parallel with an imaginary straight line extending in the second direction (+x direction) crossing the first bending axis 1BAX.

Figure 3:
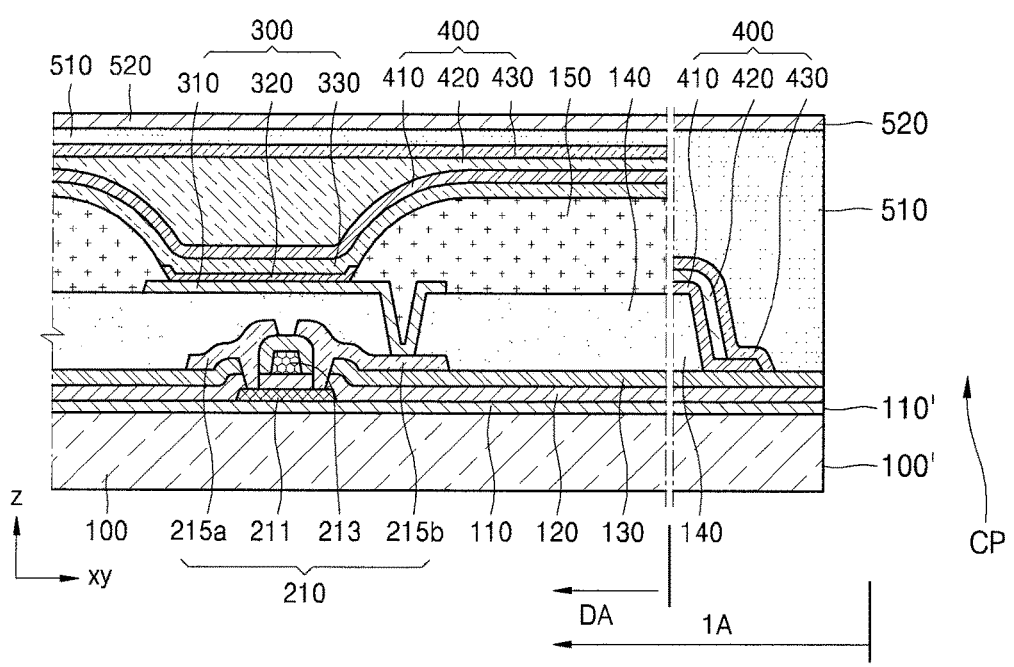
FIG. 3 is a cross-sectional view taken along the line III-Ill of FIG. 2.

The first area 1A includes a display area DA (e.g., see FIG. 3). The first area 1A may include a part of a non-display area outside the display area DA, in addition to the display area DA. The second area 2A also includes the non-display area. For example, a pad or a driving circuit for transferring electric signals that are to be applied to the display unit may be located in the second area 2A. The first bent area 1BA and the second bent area 2BA may each include a part of the display area DA and/or a part of the non-display area.

Here, the display apparatus has a cut-off portion CP extending in the first area 1A at a portion where a first imaginary line passing through the first bent area 1BA in parallel with the first bending axis 1BAX crosses a second imaginary line passing through the second bent area 2BA in parallel with the second bending axis 2BAX.

Figure 2:
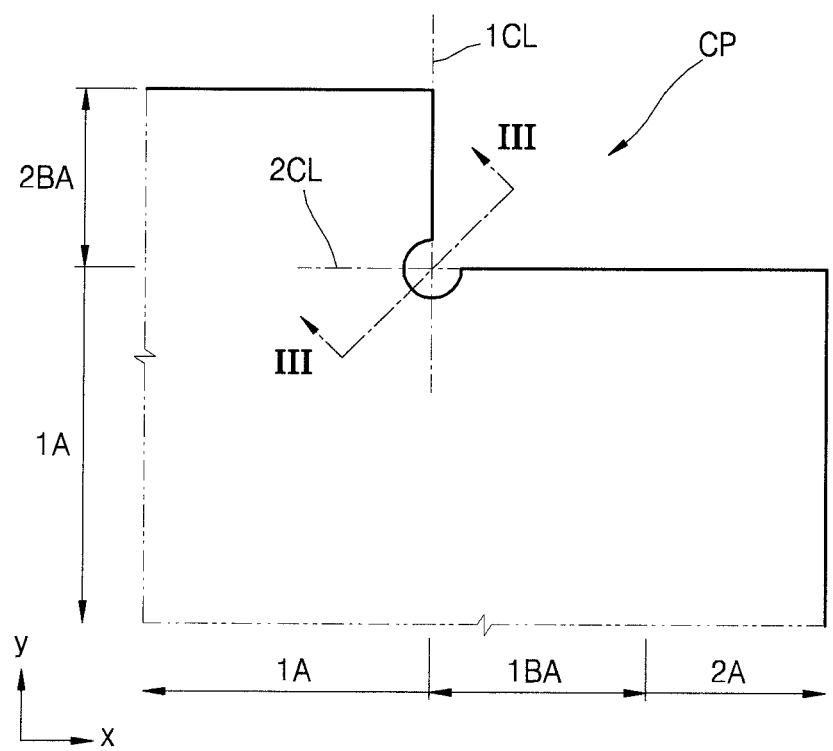
FIG. 2 is a schematic plan view of a part of FIG. 1.

FIG. 2 is a schematic plan view of the display apparatus of FIG. 1 including the cut-off portion CP, and FIG. 3 is a schematic cross-sectional view taken along the line of FIG. 2. In FIG. 2, the display apparatus is in a flat state, that is, the display apparatus is not bent at the first bent area 1BA and the second bent area 2BA, for convenience of description. However, as shown in FIG. 1, the first bent area 1BA is bent about the first bending axis 1BAX, and the second bent area 2BA is bent about the second bending axis 2BAX. This will be applied to other plan views that will be described later. During manufacturing processes, the substrate 100 is cut as shown in FIG. 2, and afterwards, the display apparatus as illustrated with reference to FIG. 1 may be manufactured by bending the first bent area 1BA and the second bent area 2BA.

As shown in FIGS. 1 and 2, the cut-off portion CP extends in the first area 1A. In FIG. 2, a part of the cut-off portion CP is adjacent to each of the first area 1A, the first bent area 1BA, and the second bent area 2BA. The part of the cut-off portion CP extends in the second bent area 2BA and/or the first area 1A over a first cutting line 1CL that forms most of a boundary between the second bent area 2BA and the cut-off portion CP. The part of the cut-off portion CP also extends in the first bent area 1BA and/or the first area 1A over a second cutting line 2CL that forms most of a boundary between the first bent area 1BA and the cut-off portion CP and between the second area 2A and the cut-off portion CP.

As described above, the first area 1A is not the bent area, but is an area that maintains a flat state, and the bending is performed at the first bent area 1BA and the second bent area 2BA. The bending may be performed concurrently (e.g., simultaneously) at the first bent area 1BA and the second bent area 2BA because of the cut-off portion CP. Moreover, because the cut-off portion CP has a shape extending in the first area 1A, generation of defects in the first bent area 1BA and/or the second bent area 2BA around the cut-off portion CP may be reduced or prevented.

If the cut-off portion CP does not extend in the first area 1A, but only has a shape defined by the first cutting line 1CL and the second cutting line 2CL (e.g., if the cut-off portion CP only has a rectangular shape that does not have a portion extending in the first area 1A), unlike the example illustrated with reference to FIG. 2, defects may occur while bending the first bent area 1BA and the second bent area 2BA. For example, stress may be applied to the display apparatus when the display apparatus is bent at the first bent area 1BA and the second bent area 2BA, and accordingly, stress may concentrate at a portion adjacent to each of the first bent area 1BA, the second bent area 2BA, and the first area 1A. Accordingly, the substrate 100 may break around the portion. Further, while bending the display apparatus at the first bent area 1BA and the second bent area 2BA, portions adjacent to each other in the first bent area 1BA, the second bent area 2BA, and/or the first area 1A may corrugate.

However, the display apparatus according to an embodiment of the inventive concept has the cut-off portion CP that extends in the first area 1A, as described above. Accordingly, even when the bending is performed at the first bent area 1BA and the second bent area 2BA, transfer of stress generated due to the bending at the first bent area 1BA to the first area 1A or the second bent area 2BA may be prevented or reduced, and likewise, transfer of stress generated due to the bending at the second bent area 2BA to the first area 1A or the first bent area 1BA may be prevented or reduced. Therefore, breaking of the substrate 100 or corrugation of the substrate 100 due to the bending at the first bent area 1BA and/or the second bent area 2BA may be effectively prevented or reduced.

FIG. 3 is a schematic cross-sectional view taken along the line III-III of FIG. 2, illustrating a case in which an organic light-emitting device is provided as an example of a display device 300. Hereinafter, the display apparatus according to an embodiment will be described below with reference to FIG. 3.

In the display area DA of the substrate 100, in addition to the display device 300, a thin film transistor (TFT) 210 may be located, and the TFT 210 may be electrically connected to the display device 300, as shown in FIG. 3. The display device 300 may be electrically connected to the TFT 210 through a pixel electrode 310 of the display device 300 that is electrically connected to the TFT 210.

The TFT 210 may include a semiconductor layer 211, a gate electrode 213, a source electrode 215a, and a drain electrode 215b. The semiconductor layer 211 may include an amorphous silicon, a polycrystalline silicon, and/or an organic semiconductor material. In order to ensure insulation between the semiconductor layer 211 and the gate electrode 213, a gate insulating layer 120 may be between the semiconductor layer 211 and the gate electrode 213. The gate insulating layer 120 may include an inorganic material, such as silicon oxide, silicon nitride, and/or silicon oxynitride. In addition, an interlayer insulating layer 130 may be on the gate electrode 213, and the source electrode 215a and the drain electrode 215b may be on the interlayer insulating layer 130. The interlayer insulating layer 130 may include an inorganic material, such as silicon oxide, silicon nitride, and/or silicon oxynitride. The insulating layers including the inorganic material may be formed by chemical vapor deposition (CVD) and/or atomic layer deposition (ALD). This may be applied to other embodiments and modifications thereof that will be described later.

A buffer layer 110 may be between the TFT 210 and the substrate 100. The buffer layer 110 may include an inorganic material, such as silicon oxide, silicon nitride, and/or silicon oxynitride. The buffer layer 110 may improve smoothness of an upper surface of the substrate 100, and/or prevent or reduce infiltration of impurities from the substrate 100 into the semiconductor layer 211 of the TFT 210.

A planarization layer 140 may be arranged on the TFT 210. For example, as shown in FIG. 3, when the organic light-emitting device is on the TFT 210, the planarization layer 140 may planarize an upper portion of a protective layer covering the TFT 210. The planarization layer 140 may include, for example, an organic material such as acryl, benzocyclobutene (BCB), and/or hexamethyldisiloxane (HMDSO). In FIG. 3, although the planarization layer 140 is shown as having a single-layered structure, the planarization layer 140 may be variously modified. For example, the planarization layer 140 may have a multi-layered structure. In addition, as shown in FIG. 3, the planarization layer 140 may have an opening outside the display area DA, so that a part of the planarization layer 140 in the display area DA and a part of the planarization layer 140 in the second area 2A may be physically separate from each other. Thus, impurities from the outside may not reach the display area DA via the planarization layer 140.

In the display area DA of the substrate 100, the display device 300 may be on the planarization layer 140. The display device 300 may be the organic light-emitting device including the pixel electrode 310, an opposite electrode 330, and an intermediate layer 320 between the pixel electrode 310 and the opposite electrode 330. The intermediate layer 320 may include an emission layer. The pixel electrode 310 may contact one of the source electrode 215a and the drain electrode 215b via an opening formed in the planarization layer 140, and may be electrically connected to the TFT 210, as shown in FIG. 3.

A pixel-defining layer 150 may be on the planarization layer 140. The pixel-defining layer 150 includes openings corresponding respectively to sub-pixels, that is, at least an opening exposing a center portion of the pixel electrode 310, to define the pixels (or sub-pixels). Also, in the example shown in FIG. 3, the pixel-defining layer 150 increases a distance between an edge of the pixel electrode 310 and the opposite electrode 330 above the pixel electrode 310, so as to prevent an arc from being generated at the edge of the pixel electrode 310. The pixel-defining layer 150 may include an organic material, for example, polyimide (PI) and/or hexamethyldisiloxane (HMDSO).

The intermediate layer 320 of the organic light-emitting device may include one or more low-molecular weight organic materials and/or polymer materials. When the intermediate layer 320 includes a low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure. Examples of the organic materials may include copper phthalocyanine (CuPc), N,N'-Di(naphthalene-1-yl)-N,N'-diphenyl-benzidine (NPB), and/or tris-8-hydroxyquinoline aluminum ($Alq_3$). The one or more low-molecular weight organic materials may be deposited by a vacuum deposition method.

When the intermediate layer 320 includes a polymer material, the intermediate layer 320 may include an HTL and an EML. Here, the HTL may include poly(3,4-ethylenedioxythiophene) (PEDOT), and the EML may include a polyphenylenevinylene (PPV)-based and/or polyfluorene-based polymer material. The intermediate layer 320 as described above may be formed by a screen printing method, an inkjet printing method, and/or a laser-induced thermal imaging (LITI) method.

However, the intermediate layer 320 is not limited to the above examples, and may have various suitable structures. In addition, the intermediate layer 320 may include a layer that is integrally formed throughout a plurality of pixel electrodes 310, or a layer that is patterned to correspond to each of the plurality of pixel electrodes 310.

The opposite electrode 330 is arranged above the display area DA, and as shown in FIG. 3, may cover the display area DA. That is, the opposite electrode 330 may be integrally formed with respect to a plurality of organic light-emitting devices, so as to correspond to a plurality of pixel electrodes 310.

Because the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 3.

The first inorganic encapsulation layer 410 covers the opposite electrode 330, and may include silicon oxide, silicon nitride, and/or silicon oxynitride. If desired, other layers such as a capping layer may be arranged between the first inorganic encapsulation layer 410 and the opposite electrode 330. Because the first inorganic encapsulation layer 410 is formed according to a structure thereunder, the first inorganic encapsulation layer 410 may have an uneven upper surface. The organic encapsulation layer 420 covers the first inorganic encapsulation layer 410, and unlike the first inorganic encapsulation layer 410, the organic encapsulation layer 420 may have an even upper surface. In more detail, the organic encapsulation layer 420 may have an even or substantially even upper surface at a portion corresponding to the display area DA. The organic encapsulation layer 420 may include at least one material selected from the group consisting of polyethylene terephthalate (PET), polyethylene naphthalate (PEN), polycarbonate (PC), PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof outside the display area DA, so that the organic encapsulation layer 420 may not be exposed to the outside.

As described above, because the encapsulation layer 400 includes the first inorganic encapsulation layer 410, the organic encapsulation layer 420, and the second inorganic encapsulation layer 430, even if there is a crack in the encapsulation layer 400 in the above described multi-layered structure, the crack may be disconnected between the first inorganic encapsulation layer 410 and the organic encapsulation layer 420, and/or between the organic encapsulation layer 420 and the second inorganic encapsulation layer 430. As such, forming a path through which external moisture or oxygen may infiltrate into the display area DA may be prevented or reduced.

A polarization plate 520 may be on (e.g., connected to or attached to) the encapsulation layer 400 via an optically clear adhesive (OCA) 510. The polarization plate 520 may reduce reflection of external light. For example, when the external light passed through the polarization plate 520 is reflected by an upper surface of the opposite electrode 330 and then is passed through the polarization plate 520 again, the external light passes through the polarization plate 520 twice and a phase of the external light may be changed. Therefore, a phase of reflected light is different from the phase of the external light that enters the polarization plate 520, and thus, destructive interference occurs. Accordingly, the reflection of the external light may be reduced and visibility may be improved. The OCA 510 and the polarization plate 520 may cover an opening in the planarization layer 140, as shown in FIG. 3. However, the display apparatus according to one or more embodiments may not essentially include the polarization plate 520, and if desired, the polarization plate 520 may be omitted or replaced by other elements. For example, the polarization plate 520 may be omitted, and a black matrix and/or a color filter may be used to reduce reflection of external light.

When manufacturing the display apparatus according to an embodiment, a plurality of display areas DA that are separated from each other are formed concurrently (e.g., simultaneously) on one large mother substrate, and then the mother substrate is cut to manufacture a plurality of display apparatuses at the same time. Also, after cutting the mother substrate, an additional process of cutting an outer portion of each of the display apparatuses may be performed (e.g., individually performed). However, the inventive concept is not limited thereto, and one display apparatus may be manufactured at a time without using a mother substrate, and an outer portion of the display apparatus may be cut during the manufacturing processes. In either case, the cut-off portion CP between the first bent area 1BA and the second bent area 2BA is included to extend inside the first area 1A, as shown in FIGS. 1 and 2. In addition, bending may be performed at the first bent area 1BA and the second bent area 2BA.

When performing the cutting operation as described above, the insulating layers over the substrate 100, in addition to the substrate 100, are also cut concurrently (e.g., simultaneously), and thus, a side end surface 100' of the substrate 100 and side end surfaces of the insulating layers form a continuous surface in the cut-off portion CP. In FIG. 3, the side end surface 100' of the substrate 100 and a side end surface 110' of the buffer layer 110 form a continuous surface. As described above, because the cut-off portion CP extends in the first area 1A, the side end surface 100' of the substrate 100 and the side end surface 110' of the buffer layer 110 may also form a continuous surface at the extending portion of the cut-off portion CP that extends in the first area 1A. The substrate 100 may be cut in various suitable manners, for example, a laser beam may be irradiated to cut the substrate 100.

In addition, when the cut-off portion CP extends in the first area 1A, the extending portion may have various suitable shapes. For example, as shown in FIG. 2, on a plane that is in parallel with the first area 1A (and partially overlapping the first area 1A) (e.g., an x-y plane), the extension portion of the cut-off portion CP within (e.g., on the inside of) the first area 1A may have a shape of a partial circle (or quarter-circle). However, the inventive concept is not limited thereto, and on the plane that is in parallel with the first area 1A (and partially overlapping the first area 1A) (e.g., the x-y plane), the extension portion of the cut-off portion CP within the first area 1A may have a partially polygonal shape (e.g., a triangle or a square). For example, on the plane that is in parallel with the first area 1A (e.g., the x-y plane), the extension portion of the cut-off portion CP may not have a sharp portion, because stress generated during the bending process at the first bent area 1BA and the second bent area 2BA may concentrate at the sharp portion, and defects such as breaking or corrugation of the substrate 100 at the sharp portion may be caused.

Figure 4:
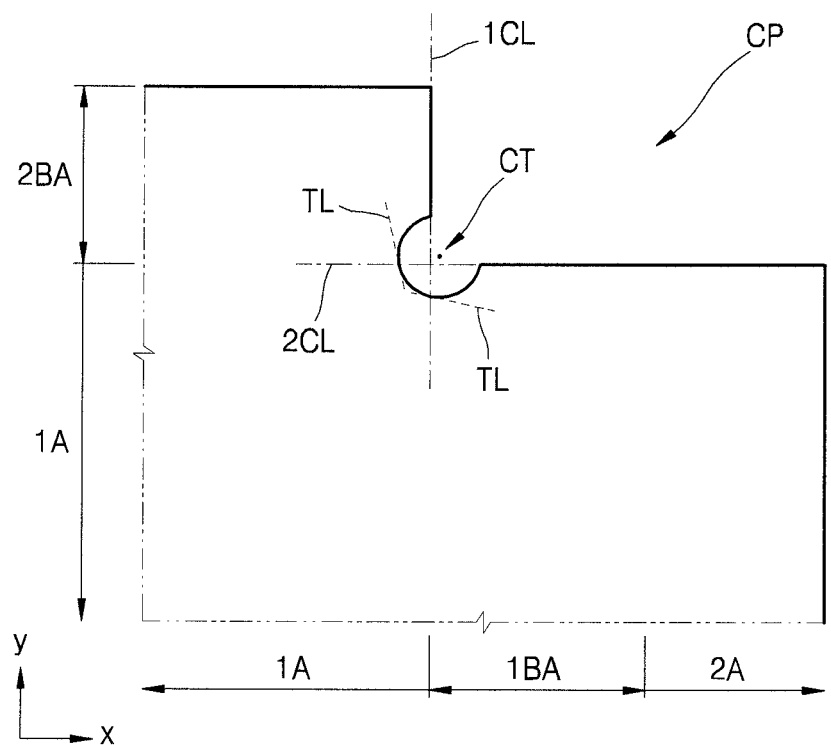
FIG. 4 is a schematic plan view of a part of a display apparatus according to an embodiment.

In addition, as shown in FIG. 4, which is a plan view of a part of a display apparatus according to an embodiment, on the plane that is in parallel with the first area 1A (and partially overlapping the first area 1A), the extension portion of the cut-off portion CP within the first area 1A is a part of a circle, and a center CT of the circle may be located outside of the first area 1A. In this case, a first tangential line TL at a point of the circle where a first boundary between the first area 1A and the first bent area 1BA meets the circle is not perpendicular to the first cutting line 1CL, and likewise, a second tangential line TL at a point of the circle where a second boundary between the first area 1A and the second bent area 2BA meets the circle is not perpendicular to the second cutting line 2CL. Accordingly, even if stress is generated due to the bending at the first bent area 1BA and at the second bent area 2BA, deformation of the first area 1A due to the stress may be reduced.

The center CT of the circle may be located within the first area 1A so that the first tangential line TL may not be perpendicular to the first cutting line 1CL and/or the second tangential line TL may not be perpendicular to the second cutting line 2CL. However, in this case, due to tolerance during the cutting process, that is, due to a positional tolerance of the laser beam irradiated to perform the cutting, a hole penetrating through the substrate 100 may be formed separate from the cut-off portion CP within the first area 1A. Therefore, in order to not generate such above described defects, the center CT of the circle may be located outside the first area 1A.

In addition, in the display apparatus illustrated in FIG. 1, the display area DA may include at least a part of the first area 1A and at least a part of the second bent area 2BA. Pads or driving circuits for transferring electric signals that are to be applied to the display unit may be located in the second area 2A, and in this case, in order to reduce an area of a dead space, that is, an area of the non-display area throughout the display apparatus, the second area 2A may overlap with the first area 1A via the bending at the first bent area 1BA. To do this, a radius of curvature R1 of the first bent area 1BA may be less than a radius of curvature R2 of the second bent area 2BA, as shown in FIG. 1.

Figure 5:
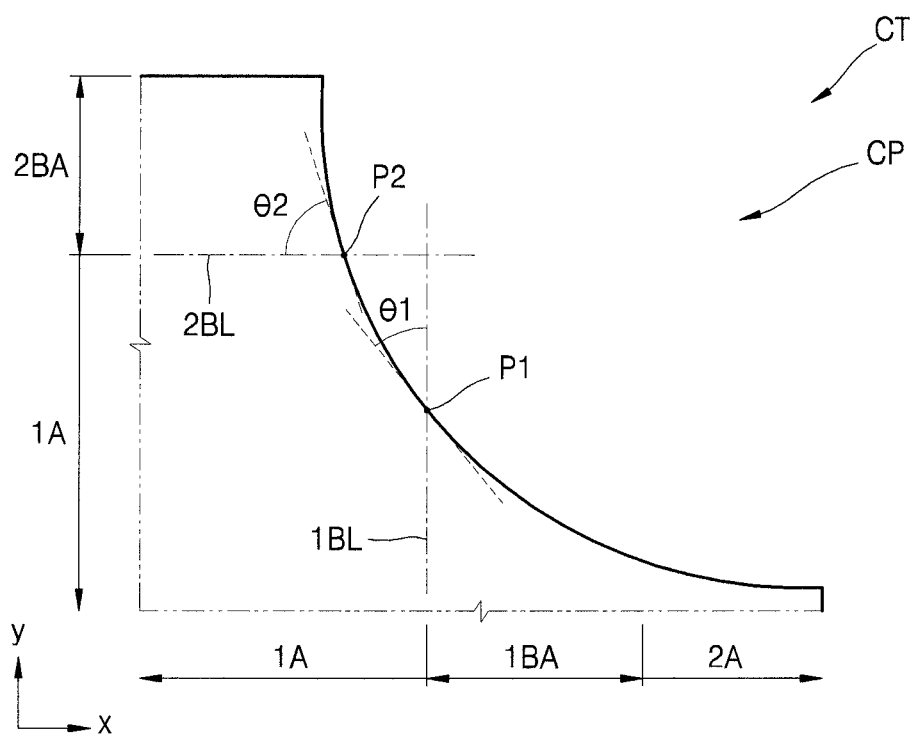
FIG. 5 is a schematic plan view of a part of a display apparatus according to an embodiment.

FIG. 5 is a plan view of a part of a display apparatus according to an embodiment. In the display apparatus according to an embodiment, the radius of curvature R1 of the first bent area 1BA is less than the radius of curvature R2 of the second bent area 2BA. As described above, in FIG. 5, the first bent area 1BA and the second bent area 2BA are shown as not being in bent states.

In the display apparatus according to an embodiment, on the plane that is in parallel with the first area 1A (and partially overlapping the first area 1A) (e.g., the x-y plane), the extension portion of the cut-off portion CP within the first area 1A is a part of a circle, and a center CT of the circle is located outside the first area 1A. Moreover, a first acute angle $\theta 1$ between a tangential line to the circle at a point P1, where a first boundary 1BL between the first area 1A and the first bent area 1BA meets the circle, and the first boundary 1BL is less than a second acute angle $\theta 2$ between a tangential line to the circle at a point P2, where a second boundary 2BL between the first area 1A and the second bent area 2BA meets the circle, and the second boundary 2BL.

As described above, because the radius of curvature in the first bent area 1BA is less than that of the second bent area 2BA, as described above, stress generated from the bending operation at the first bent area 1BA is greater than stress generated from the bending operation at the second bent area 2BA. As the stress increases, it is likely to generate deformation in the first area 1A and/or at a portion adjacent to the first area 1A, and thus, a structure capable of reducing the deformation in the first area 1A and/or the adjacent portion is desired. In order to reduce the deformation in the first area 1A and/or the adjacent portion, it may be desirable to prevent or substantially prevent rapid deformation at the boundary between the first area 1A and the adjacent portion. Therefore, a degree of deformation at the first boundary 1BL between the first bent area 1BA and the first area 1A may be less than a degree of deformation at the second boundary 2BL between the second bent area 2BA and the first area 1A.

As described above, as the first acute angle $\theta_1$ between the tangential line with respect to the circle and the first boundary 1BL at the point P1, where the first boundary 1BL between the first area 1A and the first bent area 1BA meets the circle, is decreased, it may be understood that the degree of deformation at the first boundary 1BL is small. Therefore, the first acute angle $\theta_1$ between the tangential line with respect to the circle and the first boundary 1BL at the point P1, where the first boundary 1BL between the first area 1A and the first bent area 1BA meets the circle, may be less than the second acute angle $\theta_2$ between a tangential line to the circle and the second boundary 2BL at a point P2, where the second boundary 2BL between the first area 1A and the second bent area 2BA meets the circle. Accordingly, even if the radius of curvature R1 of the first bent area 1BA is less than the radius of curvature R2 of the second bent area 2BA, generation of defects may be prevented or reduced.

Figure 6:
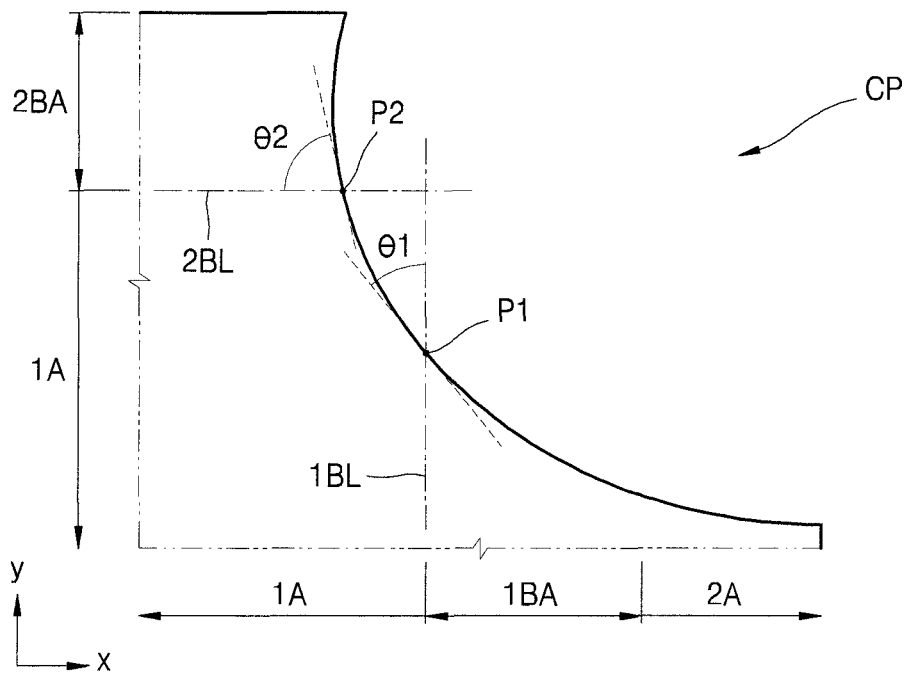
FIG. 6 is a schematic plan view of a part of a display apparatus according to an embodiment.

In FIG. 5, the extension portion of the cut-off portion CP within the first area 1A is shown to be a part of the circle, but the inventive concept is not limited thereto. For example, as shown in FIG. 6 that is a schematic plan view of a part of a display apparatus according to an embodiment, the extension portion of the cut-off portion CP within the first area 1A may be a part of an oval or a concave curve. In this case, the first acute angle $\theta_1$ between a tangential line to the oval or the curve and the first boundary 1BL at the point P1, where the first boundary 1BL between the first area 1A and the first bent area 1BA meets the oval or the curve, may be less than the second acute angle $\theta_2$ between the tangential line to the oval or the curve and the second boundary 2BL at the point P2, where the second boundary 2BL between the first area 1A and the second bent area 2BA meets the oval or the curve. Accordingly, even when the radius of curvature R1 of the first bent area 1BA is less than the radius of curvature R2 of the second bent area 2BA, generation of defects may be prevented or reduced.

Figure 7:
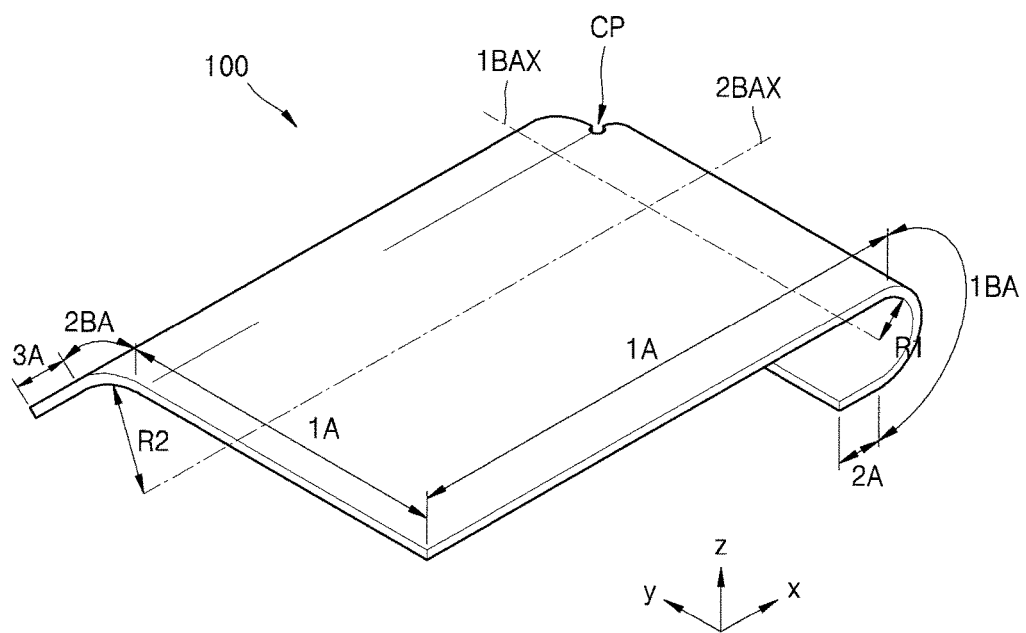
FIG. 7 is a schematic perspective view of a part of a display apparatus according to an embodiment.

In addition, it has been described that the first bent area 1BA is between the first area 1A and the second area 2A to connect the first area 1A and the second area 2A to each other, and similarly, as shown in FIG. 7, which is a schematic perspective view of a part of a display apparatus according to an embodiment, the display apparatus may have a third area 3A that is separated from the first area 1A and connected to the first area 1A via the second bent area 2BA.

According to one or more embodiments, the display apparatus may be capable of preventing or reducing generation of defects during manufacturing processes and/or while in use after being manufactured. However, the scope of the present disclosure is not limited to the above effects.

It should be understood that the example embodiments described herein should be considered in a descriptive sense only, and not for purposes of limitation. Descriptions of features and/or aspects within each embodiment should typically be considered as available for other similar features and/or aspects in other embodiments.

While one or more example embodiments have been described with reference to the figures, it will be understood by those of ordinary skill in the art that various changes in form and details may be made therein, without departing from the spirit and scope of the present invention as defined by the following claims, and their equivalents.

What is claimed is:

1. A display apparatus comprising:
    a flat first area;
    a first bent area outside the flat first area, the first bent area being bent about a first bending axis; and
    a second bent area outside the flat first area, the second bent area being adjacent to an edge of the flat first area extending in a direction crossing the first bending axis, and being bent about a second bending axis that is parallel with an imaginary line extending in a direction crossing the first bending axis,
    wherein a cut-off portion is at a portion where a first line crosses a second line, the first line being parallel with the first bending axis and passing through the first bent area, and the second line being parallel with the second bending axis and passing through the second bent area, the cut-off portion extending into the flat first area.

2. The display apparatus of claim 1, further comprising a third area separated from the flat first area and connected to the flat first area via the second bent area.

3. The display apparatus of claim 1, wherein an extension portion of the cut-off portion within the flat first area does not have a sharp portion on a plane parallel to the flat first area.

4. The display apparatus of claim 1, further comprising:
    a substrate; and
    an insulating layer over the substrate,
    wherein a side end surface of the substrate and a side end surface of the insulating layer form a continuous side surface at the cut-off portion.

5. The display apparatus of claim 1, further comprising:
    a substrate; and
    an insulating layer over the substrate,
    wherein a side end surface of the substrate and a side end surface of the insulating layer form a continuous side surface at an extension portion of the cut-off portion within the flat first area.

6. The display apparatus of claim 1, wherein a display area of the display apparatus comprises at least a portion of the flat first area and at least a portion of the second bent area.

7. The display apparatus of claim 1, wherein a radius of curvature of the first bent area is less than a radius of curvature of the second bent area.

8. The display apparatus of claim 7, wherein, on a plane parallel to the flat first area and partially overlapping the flat first area, an extension portion of the cut-off portion within the flat first area has a shape that is a part of a circle, and a first acute angle between a first boundary line where the flat first area and the first bent area meet and a tangential line at a first point where the circle and the first boundary line meet, is less than a second acute angle between a second boundary line where the flat first area and the second bent area meet and a tangential line at a second point where the circle and the second boundary line meet.

9. The display apparatus of claim 8, wherein a center of the circle is located outside the flat first area.

10. The display apparatus of claim 1, further comprising a second area separated from the flat first area, and the first bent area is between the flat first area and the second area to connect the flat first area and the second area to each other.

11. A display apparatus comprising:
    a first area;

a first bent area outside the first area, the first bent area being bent about a first bending axis; and a second bent area outside the first area, the second bent area being adjacent to an edge of the first area extending in a direction crossing the first bending axis, and being bent about a second bending axis that is parallel with an imaginary line extending in a direction crossing the first bending axis, wherein a cut-off portion is at a portion where a first line crosses a second line, the first line being parallel with the first bending axis and passing through the first bent area, and the second line being parallel with the second bending axis and passing through the second bent area, the cut-off portion extending into the first area, and wherein an extension portion of the cut-off portion within the first area has a shape that is a part of a circle on a plane parallel to the first area and partially overlapping the first area.

12. The display apparatus of claim 11, wherein a center of the circle is located outside the first area.

13. A display apparatus comprising:

a first area;

a first bent area outside the first area, the first bent area being bent about a first bending axis; and a second bent area outside the first area, the second bent area being adjacent to an edge of the first area extending in a direction crossing the first bending axis, and being bent about a second bending axis that is parallel with an imaginary line extending in a direction crossing the first bending axis, wherein a cut-off portion is at a portion where a first line crosses a second line, the first line being parallel with the first bending axis and passing through the first bent area, and the second line being parallel with the second bending axis and passing through the second bent area, the cut-off portion extending into the first area, wherein a radius of curvature of the first bent area is less than a radius of curvature of the second bent area and wherein, on a plane parallel to the first area and partially overlapping the first area, an extension portion of the cut-off portion within the first area has a concave curve shape, and a first acute angle between a first boundary line where the first area and the first bent area meet and a tangential line at a first point where the curve and the first boundary line meet, is less than a second acute angle between a second boundary line where the first area and the second bent area meet and a tangential line at a second point where the curve and the second boundary line meet.

* * * * *